United States Patent
Madni et al.

(10) Patent No.: US 6,708,316 B2
(45) Date of Patent: Mar. 16, 2004

(54) SYSTEM FOR AND METHOD OF DESIGNING AND MANUFACTURING A SEMICONDUCTOR DEVICE

(75) Inventors: Arshad Madni, Swindon (GB); Keith Strickland, Chippenham (GB); Lance Trodd, Swindon (GB); Chris Powell, Swindon (GB)

(73) Assignee: Zarlink Semiconductor Limited, Swindon (GB)

( * ) Notice: Subject to any disclaimer, the term of this patent is extended or adjusted under 35 U.S.C. 154(b) by 131 days.

(21) Appl. No.: 09/790,062

(22) Filed: Feb. 21, 2001

(65) Prior Publication Data

US 2002/0045280 A1 Apr. 18, 2002

(30) Foreign Application Priority Data

Sep. 14, 2000 (GB) .............................................. 0022502

(51) Int. Cl.$^7$ .............................................. G06F 17/50
(52) U.S. Cl. .................. 716/4; 716/2; 703/13; 703/22
(58) Field of Search ........................ 716/1, 2, 4; 703/13, 703/14, 22

(56) References Cited

U.S. PATENT DOCUMENTS 5,548,539 A * 8/1996 Vlach et al. .................... 703/6
6,321,369 B1 * 11/2001 Heile et al. .................... 716/11

OTHER PUBLICATIONS

Helmy, A. et al., "A simplified analytical model for nonlinear distorttion in RF bipolar circuits", Aug. 2000. IEEE. pp. 966–969.*

* cited by examiner

Primary Examiner—Stacy Whitmore
(74) Attorney, Agent, or Firm—Kirschstein, et al.

(57) ABSTRACT

A system and method are provided for designing and manufacturing a semiconductor device, such as part of an integrated circuit. A template comprising a basic circuit diagram of a discrete circuit block and corresponding design equations are selected from a library. Desired performance parameters are selected and the value of one or more components of the circuit block are determined to allow the block to achieve the desired performance parameters.

22 Claims, 3 Drawing Sheets

$$NF = 10\log_{10}\left\{\frac{Rs + \dfrac{Rs^2}{Rf} + \left(\dfrac{Rs+Rf}{Rf}\right)^2 \cdot Ramp}{Rs}\right\}$$

$$Ramp = 2Re + 2rbb + \frac{2\cdot\left(Re + re + \left(\dfrac{rbb+Rs}{\beta}\right)\right)^2}{Rl} + re + \frac{1}{2\beta\cdot re}\cdot(Re+Rs+rbb)^2$$

$$+ \frac{1}{2\beta\cdot re}\cdot(Re+rbb)^2$$

$$d3 = \left(\frac{vin}{Vt}\right)^2 \cdot \frac{1}{48\cdot\left(1+\dfrac{Re}{re}\right)^3}$$

SYSTEM FOR AND METHOD OF DESIGNING AND MANUFACTURING A SEMICONDUCTOR DEVICE

BACKGROUND OF THE INVENTION

The present invention relates to a system for and a method of producing a design for and manufacturing a semiconductor device. The present invention also relates to a semiconductor device manufactured by such a system or method, to a computer program for controlling a computer forming such a system, and to a medium containing such a computer program.

There is a requirement for rapid design and production of semiconductor devices such as integrated circuits which work correctly and meet their desired performance parameters "first time", in other words without requiring extensive redesign or different stages of prototyping. For example, this is required of mixer-oscillator products for use in tuners having low noise figures and high intermodulation distortion performance (IIP3). Known techniques for achieving this rely on the reuse and optimization of previously designed circuit cells for discrete circuit blocks. However, this optimization procedure is very time consuming and requires an extensive understanding of the limitations of previously used circuits.

SUMMARY OF THE INVENTION

According to a first aspect of the invention, there is provided a system for producing a design for and/or manufacturing a semiconductor device. This aspect includes a first library of at least one template, the or each of which comprises a representation of a discrete circuit block and at least one equation relating at least one performance parameter of the circuit block to at least one electrical parameter of at least one component of the circuit block. A first selecting means is operative for selecting the template or one of the templates from the library. A second selecting means is operative for selecting a desired value of the at least one performance parameter of the circuit block of the selected template. A calculating means is operative for calculating a value of the at least one electrical parameter for achieving the desired value of the at least one performance parameter by entering the desired value of the at least one performance parameter in the at least one equation and solving the at least one equation for the at least one electrical parameter so as to form a design of the semiconductor device. The design is used and acted upon to manufacture the semiconductor device.

The at least one electrical parameter may comprise a component value of the at least one component. The at least one component may comprise at least one resistive component and the component value may comprise the resistance thereof.

The at least one performance parameter may comprise a noise figure.

The at least one performance parameter may comprise a distortion value.

The first selecting means may comprise first manual selection means.

The at least one equation may comprise a plurality of simultaneous equations. The at least one performance parameter may comprise a plurality of performance parameters. The at least one electrical parameter may comprise a plurality of electrical parameters. The at least one component may comprise a plurality of components.

The calculating means may calculate a plurality of values of the at least one component, the system comprising third selecting means for selecting one of the calculated values in accordance with a predetermined criterion. The predetermined criterion may be lowest power dissipation. The system may comprise a second library of manufacturing process files, each of which comprises predetermined electrical parameters of at least one type of component of the circuit blocks. The at least one type of component may comprise a transistor. The system may comprise fourth selecting means for selecting a process file from the second library. The fourth selecting means may comprise second manual selection means. The calculating means may enter at least some of the predetermined electrical parameters of the selected process file in the at least one equation in order to calculate the value of the at least one electrical parameter. The calculating means may be arranged to calculate the size of the at least one component, such as at least one resistor in accordance with the current which it is required to pass.

The system may comprise means for producing a schematic of the circuit block of the selected template including the calculated value of the at least one electrical parameter of the at least one component. The system may comprise means for simulating the operation of the schematic including calculating a simulated value of the at least one performance parameter. The semiconductor device may comprise at least part of an integrated circuit.

The circuit block of the at least one template may comprise a long tail pair of bipolar transistors for radio frequency use, the at least one performance parameter may comprise a noise figure NF and a third order intermodulation distortion d3, the at least one electrical parameter may comprise load resistance R1, emitter degeneration resistance Re and internal emitter resistance re of the long tail pair of transistors, and the at least one equation may comprise:

$$NF = 10\log_{10}\left[\frac{Rs + \frac{Rs^2}{Rf} + \left[\frac{Rs + Rf}{Rf}\right]^2}{Rs}\right] \cdot Ramp$$

$$Ramp = 2Re + 2rbb + \frac{2\left[Re + re + \left[\frac{rbb + Rs}{\beta}\right]\right]^2}{Rl} +$$

$$re + \frac{1}{2\beta \cdot re}(Re + Rs + rbb)^2 + \frac{1}{2\beta \cdot re}(Re + rbb)^2$$

$$d3 = \frac{\left(\frac{vin}{Vt}\right)^2}{48\left[1 + \frac{Re}{re}\right]^3}$$

where

Rs is the source resistance to which the long tail pair is to be connected;

Rf is a feedback resistance of the long tail pair;

rbb is the base spreading resistance of the bipolar transistors;

β is the current gain of the bipolar transistors;

re=50 mV/Iee; and

Iee is the emitter current of the bipolar transistors.

The system may comprise a computer programmed by a computer program.

According to a second aspect of the invention, there is provided a method of producing a design for and/or manufacturing a semiconductor device. This aspect includes the steps of selecting from a library a template comprising a representation of a discrete circuit block and at least one equation relating at least one performance parameter of the circuit block to at least one electrical parameter of at least one component of the circuit block; selecting a desired value of the at least one performance parameter of the circuit block; calculating a value of the at least one electrical parameter for achieving the desired value of the at least one performance parameter by entering the desired value of the at least one performance parameter in the at least one equation; and solving the at least one equation for the at least one electrical parameter so as to form a design of the semiconductor device; and using and acting on the design to manufacture the semiconductor device.

According to a third aspect of the invention, there is provided a semiconductor device manufactured by a system according to the first aspect of the invention or by a method according to the second aspect of the invention.

According to a fourth aspect of the invention, there is provided a computer program for a computer for constituting the system according to the first aspect of the invention.

According to a fifth aspect of the invention, there is provided a medium containing a computer program according to the third aspect of the invention.

It is thus possible to provide a system which is able to optimize one or more different types of discrete circuit blocks from a library of such blocks. In particular, it is possible to produce a semiconductor device, which may be part of an integrated circuit, which meets one or more performance parameters essentially merely by specifying the desired values of such parameters. It has been found that values of components of such circuit blocks can be derived from the required performance parameters and the resulting designs when produced can achieve the required performance parameters with a very high probability. This probability can be increased by automatically simulating the resulting designs and this allows checking of whether the desired performance parameters can be met, for example over a range of temperatures and supply voltages. Thus, the extensive optimization procedures and prototyping steps of known techniques can be substantially avoided or at least greatly reduced. Thus, productivity can be increased without compromising design integrity.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENTS

Figure 1:
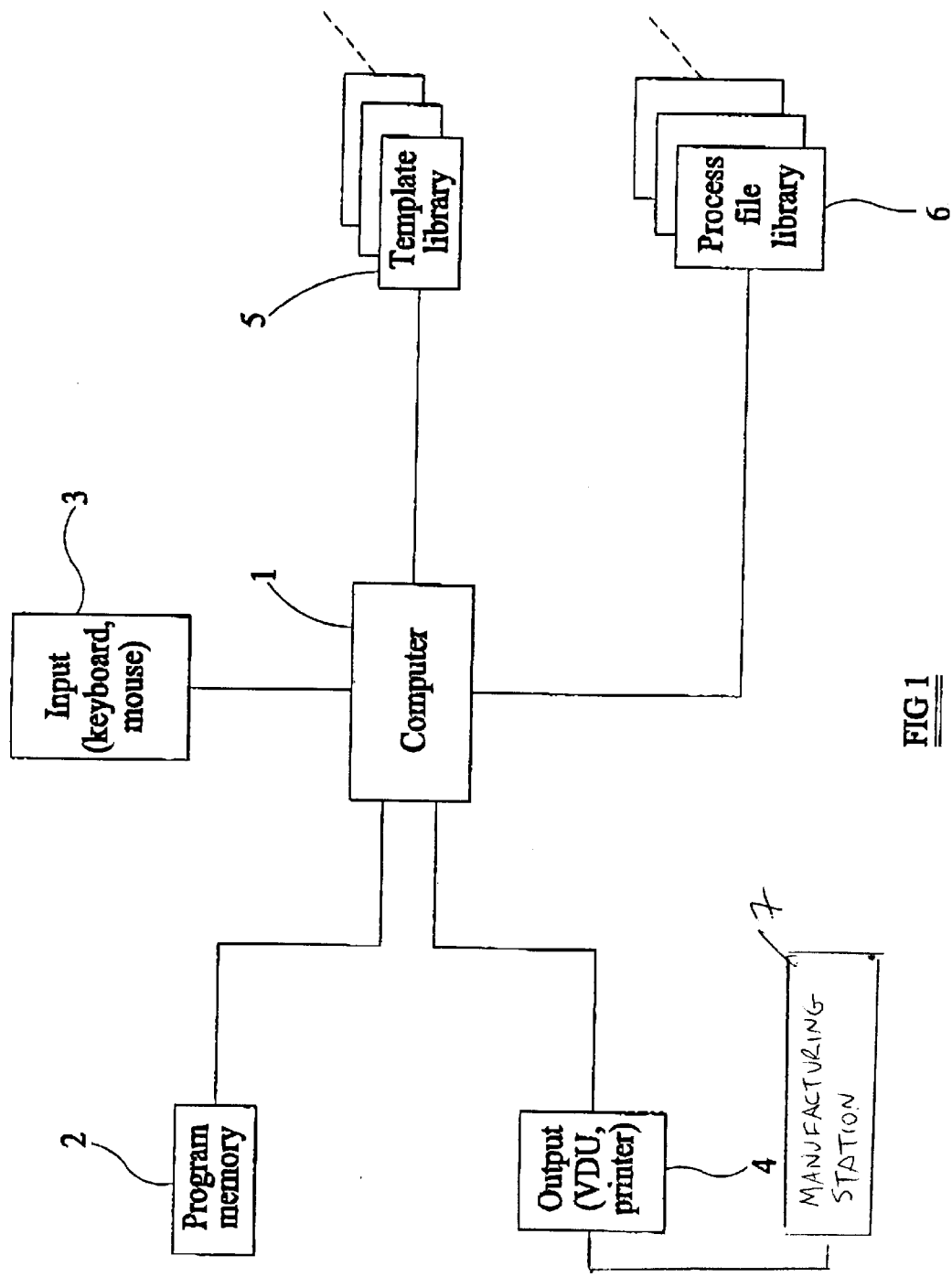
FIG. 1 is a block schematic diagram of part of a system constituting an embodiment of the invention.

Although the system for manufacturing a semiconductor device may in principle be used with any type of circuit block, for example for forming part or the whole of an integrated circuit, the embodiment described hereinafter is with reference to a long tail pair of bipolar junction transistors constituting a radio frequency amplifier, for example for use as part of the "front end" of a tuner for receiving signals from a cable distribution network or a terrestrial or satellite antenna. As shown in FIG. 1, the system comprises a computer 1 provided with a program memory 2 containing a program for controlling the operation of the computer 1. The computer 1 is provided with an input device or arrangement 3, for example in the form of a keyboard and/or mouse to allow manual input and selection. The computer is also provided with an output device or arrangement 4, for example in the form of a visual display unit (VDU) and/or a printer.

The computer 1 is also provided with a template library 5 which contains one or more templates which are manually selectable, for example by a user operating the input device or arrangement 3. Each template contains information about a discrete circuit block as described hereinafter. The library may, for example, be contained in the memory 2. The computer 1 is provided with a process file library 6 which contains files relating to one or more manufacturing processes for semiconductor devices such as integrated circuits and which may also, for example, be contained in the memory 2. A typical process file will be described in more detail hereinafter. The libraries 5 and 6 are embodied as data stored in any appropriate storage medium or means accessible to the computer 1.

Figure 2:
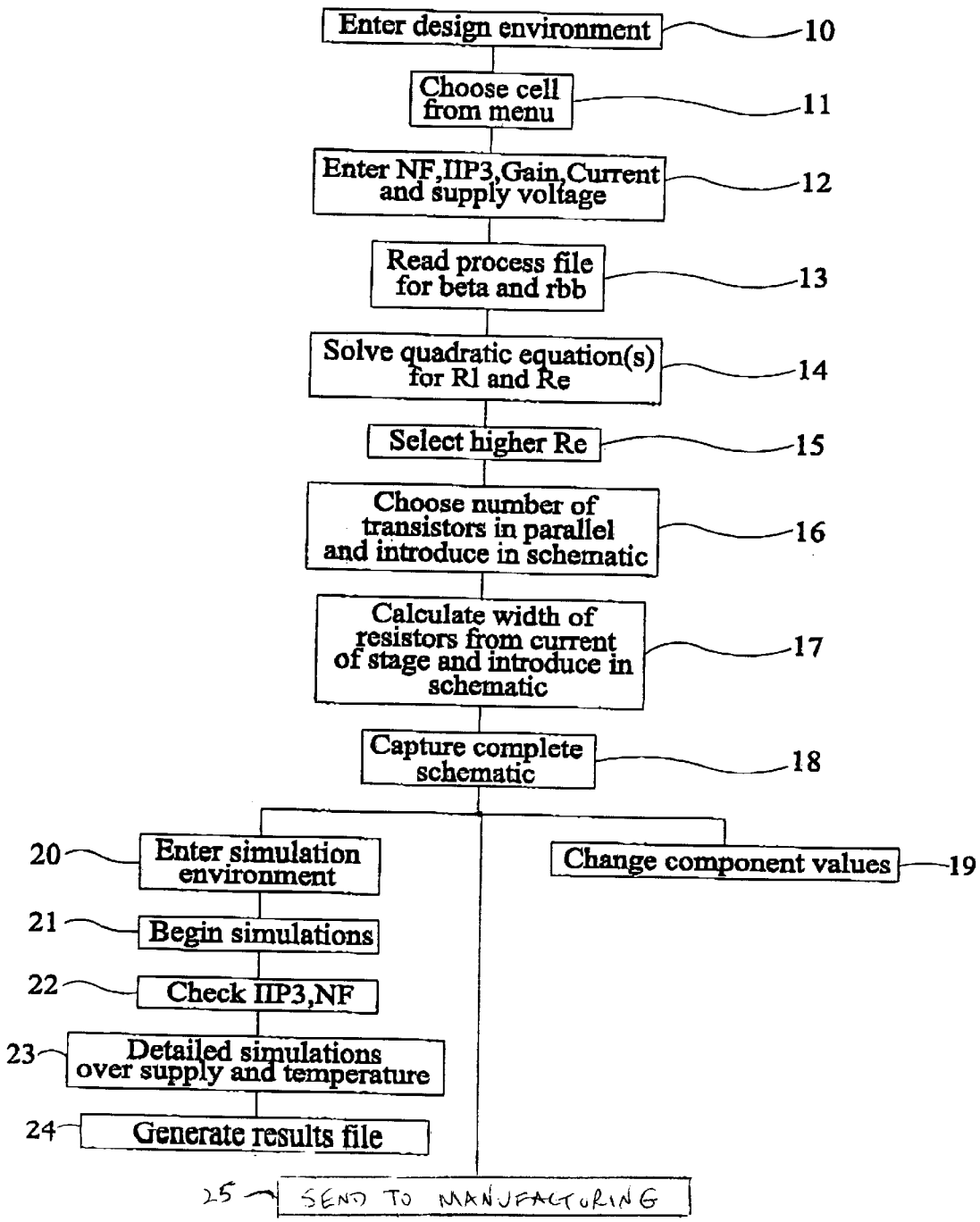
FIG. 2 is a schematic flow diagram illustrating the operation of the system of FIG. 1.
Figure 3:
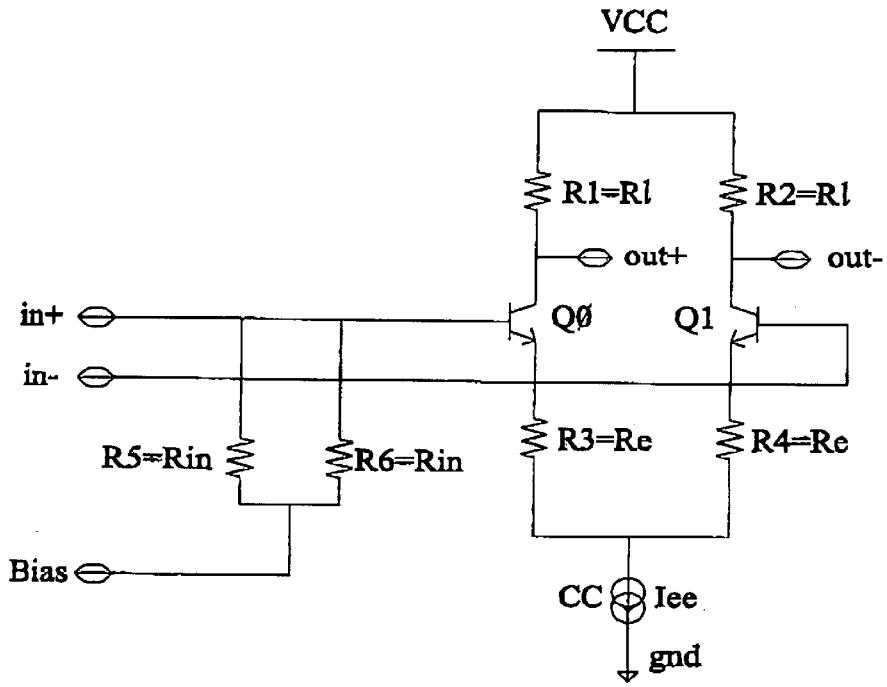
FIG. 3 is a diagram illustrating a discrete circuit block and associated equations representing a template of a library of the system of FIG. 1.

FIG. 2 illustrates an operation of the system of FIG. 1 for designing and manufacturing a long tail pair radio frequency amplifier. A design environment is entered at a step 10 and a discrete circuit block or a "cell" is chosen from a menu in a step 11. For example, the computer 1 displays a menu or set of nested menus on the output device 4 and a user selects the desired cell by means of the input device 3. In the example being described, the user selects a template in the form of a representation of a long tail pair of bipolar junction transistors and a corresponding set of equations as illustrated in FIG. 3. The user is then prompted to enter the desired performance parameters of the radio frequency amplifier to be performed by the long tail pair and, in a step 12, enters the desired noise figure, third order intermodulation distortion (IIP3), the desired gain of the amplifier, the desired current consumption and the nominal supply voltage.

At a step 13, various electrical parameters required for calculating the component values are read from one of the process files in the library 6. Although it is possible for the system to select automatically the most appropriate manufacturing process or one of the suitable manufacturing processes for forming the semiconductor device from the library 6, this may be done manually. For example, the computer 1 displays a menu of the available manufacturing processes corresponding to the files of the library 6 on the output device 4 and the user selects the desired manufacturing process and hence the corresponding file of the library 6 by means of the input device 3. This results in predetermined electrical parameters of components formed by the selected manufacturing process being made available for subsequent calculations. In the example illustrated, the step 13 reads the predetermined parameters of transistor current gain ($\beta$ or "beta") and the base spreading resistance rbb of the bipolar junction transistors which are produced by the selected manufacturing process.

In a step 14, the "design" equations for the selected circuit block from the library 5 are solved. In the case of the long tail pair amplifier as shown in FIG. 3, the circuit obtained from the library 5 comprises transistors Q0 and Q1 whose bases are connected to complementary inputs in+ and in−. The bases are also connected via respective resistors R5 and R6 to a bias voltage source and the values Rin of the resistors R5 and R6 constitute the input impedance of the long tail pair amplifier.

The emitters of the transistors Q0 and Q1 are connected via resistors R3 and R4 to a constant current source CC which supplies a tail current Iee of the long tail pair. The resistors R3 and R4 form emitter degeneration resistors, each having a value Re.

The collectors of the transistors Q0 and Q1 are connected to a supply line VCC via load resistors R1 and R2, respectively, each having a value R1.

When the long tail pair illustrated in FIG. 3 is driven by a source impedance Rs, the noise figure NF is given by:

$$NF = 10\log_{10}\left[\frac{Rs + \frac{Rs^2}{Rf} + \left(\frac{Rs+Rf}{Rf}\right)^2 \cdot Ramp}{Rs}\right]$$

where:

$$Ramp = 2Re + 2rbb + \frac{\left[Re + re + \left(\frac{rbb+Rs}{\beta}\right)\right]^2}{Rl} +$$

$$re + \frac{1}{2\beta \cdot re} \cdot (Re + Rs + rbb)^2 + \frac{1}{2\beta \cdot re} \cdot (Re + rbb)^2$$

where:
Rf is a feedback resistor;
rbb is the base spreading resistance of each of the transistors Q0 and Q1;
β is the current gain of each of the transistors Q0 and Q1;
re is the diode resistance of each of the transistors Q0 and Q1 given by 50 mV/Iee; and
Iee is the total tail current.

The third order distortion d3 when the long tail pair is driven by two sine wave generators, each of peak amplitude vin, is given by:

$$d3 = \frac{\left(\frac{vin}{Vt}\right)^2}{48\left(1 + \frac{Re}{re}\right)^3}$$

where Vt is the thermal voltage.

These equations are effectively quadratic and can be solved analytically so as to provide values for the emitter degeneration resistance Re and the collector load resistance R1 of the long tail pair. In general, the solutions for these electrical parameters or nominal component values of the resistors R1 to R4 will give two values, for example for the emitter degeneration resistors Re. A step 15 selects the value of Re from the solutions obtained in the step 14 in accordance with a predetermined criterion. For example, the step 15 selects the higher value of Re so as to minimize the power dissipation of the circuit block.

A step 16 selects other features to be introduced in the schematic of the long tail pair. In the example shown, the step 16 chooses the number of parallel-connected transistors which are to constitute the long tail pair transistors Q0 and Q1. The system also calculates, in a step 17, the physical sizes of various of the components of the long tail pair and, in this particular example, calculates the required widths or minimum widths of the resistors R1 to R4 in accordance with the current passing through the long tail pair of transistors. This is also introduced into the schematic.

A step 18 illustrates completion of the capture of the schematic for the actual circuit for meeting the performance parameters as specified in the step 12. This is effectively constituted by the final detailed circuit design, the physical layout design, and the values of all of the components making up the final long tail pair radio frequency amplifier.

The schematic formed by the step 18 is then output, to an arrangement 7 in FIG. 1 for forming masks for manufacturing the semiconductor device. The possibility of changing component values at this stage is illustrated by a step 19. However, before actually manufacturing or prototyping a device in accordance with the design whose schematic has been formed in the step 18, the design may be simulated to provide a confirmation that the desired performance parameters, in particular the noise figure and the intermodulation distortion values entered in the step 12, are likely to be achieved.

For this purpose, a simulation environment is entered in a step 20 and a step 21 begins the simulation. This may be performed by the computer 1 under the control of the program memory 2 which contains a program for performing the simulation. As an alternative, the captured complete schematic may be supplied to a different system for performing the simulation, for example also based on a programmed computer.

When the simulation has been completed, a step 22 checks whether the distortion and noise performance meet the minimum requirements as entered in the step 12. Further simulations are then performed in a step 23, for example over a range of supply voltages and temperatures, to check whether the required specifications are met over the specified operating range for the actual device. The results of the simulations are then generated in a step 24.

Assuming that the simulations indicate that the required specifications are likely to be met, the complete schematic captured in the step 18 is then supplied in a step 25 to further processes for actually manufacturing semiconductor devices such as integrated circuits comprising or including the long tail pair radio frequency amplifier. The system ensures that there is a very high probability of most or all manufactured devices meeting the desired specification, for example in terms of noise figure and intermodulation distortion over the ranges of supply voltage and operating temperature specified for the device.

It will be understood that each of the elements described above, or two or more together, also may find a useful application in other types of constructions differing from the types described above.

While the invention has been illustrated and described as embodied in a system for and method of designing and manufacturing a long tail pair of bipolar junction transistors it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

We claim:

1. A system for producing a design of a semiconductor device, comprising:
   a) a template library for storing at least one template including
      i) a representation of an electrical circuit block having at least one electrical component which has at least one electrical parameter, the circuit block having at least one performance quality parameter representing a performance quality of the circuit block, and
      ii) at least one relationship relating said at least one performance quality parameter to said at least one electrical parameter;
   b) a selector for selecting said at least one template from the template library, and for selecting a desired value for said at least one performance quality parameter;
   c) a processor for determining a parameter value of said at least one electrical parameter for achieving the desired value for said at least one performance quality parameter by processing said desired value in said at least one relationship; and
   d) an output device for outputting the parameter value determined by the processor to produce the design of the semiconductor device.

2. The system of claim 1, wherein the template library is operative for storing additional templates, and wherein the selector is operative for manually selecting one of the templates.

3. The system of claim 1, wherein said at least one electrical parameter is a component value of said at least one electrical component.

4. The system of claim 3, wherein said at least one electrical component is a resistor, and wherein the component value is a resistance of the resistor.

5. The system of claim 1, wherein said at least one performance quality parameter is a noise figure.

6. The system of claim 1, wherein said at least one performance quality parameter is a distortion value.

7. The system of claim 1, wherein said at least one relationship includes at least one equation, wherein the selector is operative for manually entering the desired value in said at least one equation, and wherein the processor is operative for solving said at least one equation for the parameter value based on the desired value entered by the selector.

8. The system of claim 7, wherein said at least one relationship includes additional simultaneous equations, and wherein the processor is operative for solving all of the equations.

9. The system of claim 8, wherein said at least one performance quality parameter comprises a plurality of performance quality parameters, wherein said at least one electrical parameter comprises a plurality of electrical parameters, and wherein said at least one electrical component comprises a plurality of electrical components.

10. The system of claim 1, wherein the processor is operative for determining a plurality of parameter values of said at least one electrical parameter, and wherein the selector is operative for selecting one of the parameter values in accordance with a predetermined criterion.

11. The system of claim 10, wherein the predetermined criterion is lowest power dissipation.

12. The system of claim 1; and further comprising a process library for storing at least one manufacturing process file including a predetermined electrical parameter for at least one type of said at least one electrical component of the electrical circuit block, and wherein the selector is operative for selecting said at least one process file from the process library to make the predetermined electrical parameter available to the processor.

13. The system of claim 12, wherein said at least one type of component includes a transistor.

14. The system of claim 1, wherein the processor is operative for determining a physical size of said at least one component as a function of the parameter value.

15. The system of claim 1, wherein the output device is operative for producing an electrical schematic of said at least one template selected by the selector, the schematic including the parameter value determined by the processor.

16. The system of claim 15; and further comprising means for performing a simulation of the design represented by the schematic to obtain a simulated value for said at least one performance quality parameter, and for comparing the simulated value with the desired value.

17. The system of claim 1, wherein the design of the semiconductor device is at least part of a design for an integrated circuit.

18. The system of claim 1, wherein the circuit block of said at least one selected template comprises a long tail pair of bipolar transistors for radio frequency use, said at least one performance parameter comprises a noise figure NF and a third order intermodulation distortion d3, said at least one electrical parameter comprises load resistance Rl, emitter degeneration resistance Re and internal emitter resistance re of the long tail pair of transistors, and said at least one relationship comprises the following equations:

$$NF = 10\log_{10}\left[\frac{Rs + \frac{Rs^2}{Rf} + \left[\frac{Rs+Rf}{Rf}\right]^2}{Rs} \cdot Ramp\right]$$

$$Ramp = 2Re + 2rbb + \frac{2\left[Re+re+\left[\frac{rbb+Rs}{\beta}\right]\right]^2}{Rl} +$$

$$re + \frac{1}{2\beta \cdot re}(Re+Rs+rbb)^2 + \frac{1}{2\beta \cdot re}(Re+rbb)^2$$

$$d3 = \frac{\left(\frac{vin}{Vt}\right)^2}{48\left[1+\frac{Re}{re}\right]^3}$$

where:
   Rs is the source resistance to which the long tail pair is to be connected;
   Rf is a feedback resistance of the long tail pair;
   rbb is a base spreading resistance of the bipolar transistors;
   β is a current gain of the bipolar transistors;
   re=50 mV/Iee; and
   Iee is the emitter current of the bipolar transistors.

19. The system of claim 1, wherein the system includes a programmed computer.

20. A system for manufacturing a semiconductor device, comprising:
   a) a template library for storing at least one template including
      i) a representation of an electrical circuit block having at least one electrical component which has at least one electrical parameter, the circuit block having at least one performance quality parameter representing a performance quality of the circuit block, and
ii) at least one relationship relating said at least one performance quality parameter to said at least one electrical parameter;
b) a selector for selecting said at least one template from the template library, and for selecting a desired value for said at least one performance quality parameter;
c) a processor for determining a parameter value of said at least one electrical parameter for achieving the desired value for said at least one performance quality parameter by processing said desired value in said at least one relationship; and
d) an output device for using the parameter value determined by the processor to manufacture the semiconductor device.

21. A method of producing a design of a semiconductor device, comprising the steps of:
 a) storing at least one template including
  i) a representation of an electrical circuit block having at least one electrical component which has at least one electrical parameter, the circuit block having at least one performance quality parameter representing a performance quality of the circuit block, and
  ii) at least one relationship relating said at least one performance quality parameter to said at least one electrical parameter;
 b) selecting said at least one template, and selecting a desired value for said at least one performance quality parameter;
 c) determining a parameter value of said at least one electrical parameter for achieving the desired value for said at least one performance quality parameter by processing said desired value in said at least one relationship; and
 d) outputting the parameter value to produce the design of the semiconductor device.

22. A method of manufacturing a semiconductor device, comprising the steps of:
 a) storing at least one template including
  i) a representation of an electrical circuit block having at least one electrical component which has at least one electrical parameter, the circuit block having at least one performance quality parameter representing a performance quality of the circuit block, and
  ii) at least one relationship relating said at least one performance quality parameter to said at least one electrical parameter;
 b) selecting said at least one template, and selecting a desired value for said at least one performance quality parameter;
 c) determining a parameter value of said at least one electrical parameter for achieving the desired value for said at least one performance quality parameter by processing said desired value in said at least one relationship; and
 d) using the parameter value to manufacture the semiconductor device.

* * * * *